(12) United States Patent
Goss et al.

(10) Patent No.: US 9,043,668 B2
(45) Date of Patent: May 26, 2015

(54) USING ECC DATA FOR WRITE DEDUPLICATION PROCESSING

(71) Applicant: Seagate Technology LLC, Cupertino, CA (US)

(72) Inventors: Ryan James Goss, Prior Lake, MN (US); Mark Allen Gaertner, Vadnais Heights, MN (US); Jon D. Trantham, Chanhassen, MN (US)

(73) Assignee: Seagate Technology LLC, Cupertino, CA (US)

( * ) Notice: Subject to any disclaimer, the term of this patent is extended or adjusted under 35 U.S.C. 154(b) by 290 days.

(21) Appl. No.: 13/762,436

(22) Filed: Feb. 8, 2013

(65) Prior Publication Data

US 2014/0229790 A1    Aug. 14, 2014

(51) Int. Cl.
   *H03M 13/00*    (2006.01)
   *H03M 13/29*    (2006.01)

(52) U.S. Cl.
   CPC ................................ *H03M 13/2906* (2013.01)

(58) Field of Classification Search
   CPC ....................... H03M 13/2906; G06F 12/0246
   USPC ............................ 711/216; 714/755, 769, 773
   See application file for complete search history.

(56) References Cited

U.S. PATENT DOCUMENTS

| | | | |
|---|---|---|---|
| 6,467,060 B1 | 10/2002 | Malakapalli et al. | |
| 7,162,678 B2* | 1/2007 | Saliba ........................... | 714/758 |
| 7,783,955 B2 | 8/2010 | Murin | |
| 7,904,790 B2 | 3/2011 | Lee et al. | |
| 7,979,670 B2 | 7/2011 | Saliba et al. | |
| 8,122,322 B2 | 2/2012 | Miller | |
| 8,332,616 B2 | 12/2012 | Saliba et al. | |
| 8,458,566 B2* | 6/2013 | Peng et al. ..................... | 714/773 |
| 2008/0148126 A1 | 6/2008 | Eilert et al. | |
| 2010/0088550 A1 | 4/2010 | Imai et al. | |
| 2011/0060861 A1* | 3/2011 | Warren ......................... | 711/103 |
| 2012/0005412 A1 | 1/2012 | Ware | |
| 2012/0166716 A1 | 6/2012 | Schuette et al. | |

* cited by examiner

*Primary Examiner* — David Ton
(74) *Attorney, Agent, or Firm* — Hall Estill Attorneys at Law

(57) ABSTRACT

Method and apparatus for managing data in a memory. In accordance with some embodiments, a first data object and an associated first ECC data set are generated and stored in a non-volatile (NV) main memory responsive to a first set of data blocks having a selected logical address. A second data object and an associated second ECC data set are generated responsive to receipt of a second set of data blocks having the selected logical address. The second data object and the second ECC data set are subsequently stored in the in the NV main memory responsive to a mismatch between the first ECC data set and the second ECC data set.

20 Claims, 5 Drawing Sheets

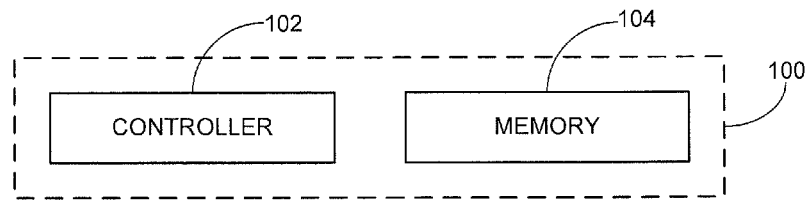
FIG. 1
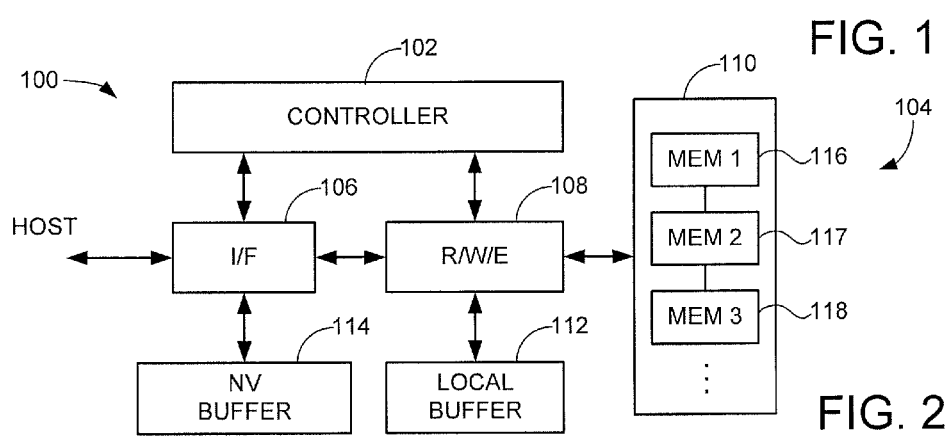
FIG. 2
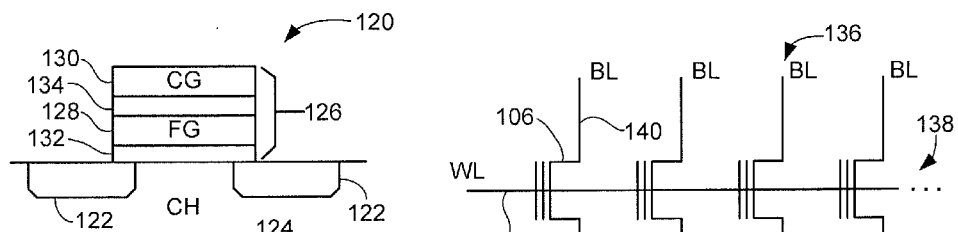
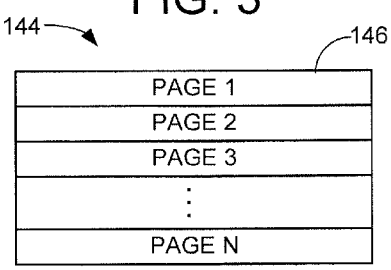
FIG. 3
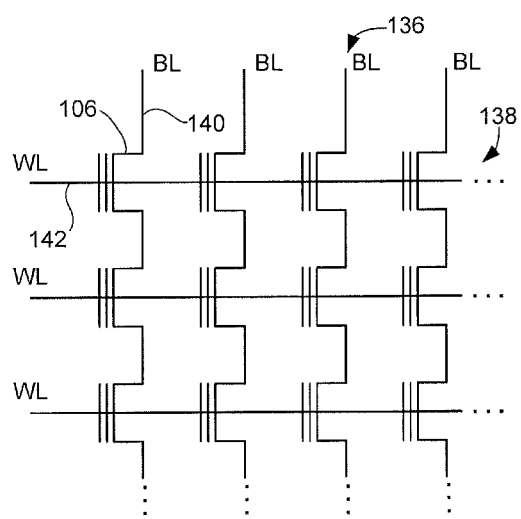
FIG. 5
FIG. 4

USING ECC DATA FOR WRITE DEDUPLICATION PROCESSING

SUMMARY

Various embodiments of the present disclosure are generally directed to managing data in a data storage device.

In accordance with some embodiments, a first data object and an associated first ECC data set are generated and stored in a non-volatile (NV) main memory responsive to a first set of data blocks having a selected logical address. A second data object and an associated second ECC data set are generated responsive to receipt of a second set of data blocks having the selected logical address. The second data object and the second ECC data set are subsequently stored in the in the NV main memory responsive to a mismatch between the first ECC data set and the second ECC data set.

These and other features and aspects which characterize various embodiments of the present invention can be understood in view of the following detailed discussion and the accompanying drawings.

BRIEF DESCRIPTION OF THE DRAWINGS

FIG. 1 provides is a functional block representation of a data storage device in accordance with various embodiments of the present disclosure.

FIG. 2 illustrates aspects of the device of FIG. 1 in accordance with some embodiments.

FIG. 3 depicts a flash memory cell from the flash memory of FIG. 2.

FIG. 4 schematically represents a portion of an array of flash memory cells in accordance with some embodiments.

FIG. 5 depicts an erasure block of the flash memory array of FIG. 2.

DETAILED DESCRIPTION

Figures 6, 7, 8:
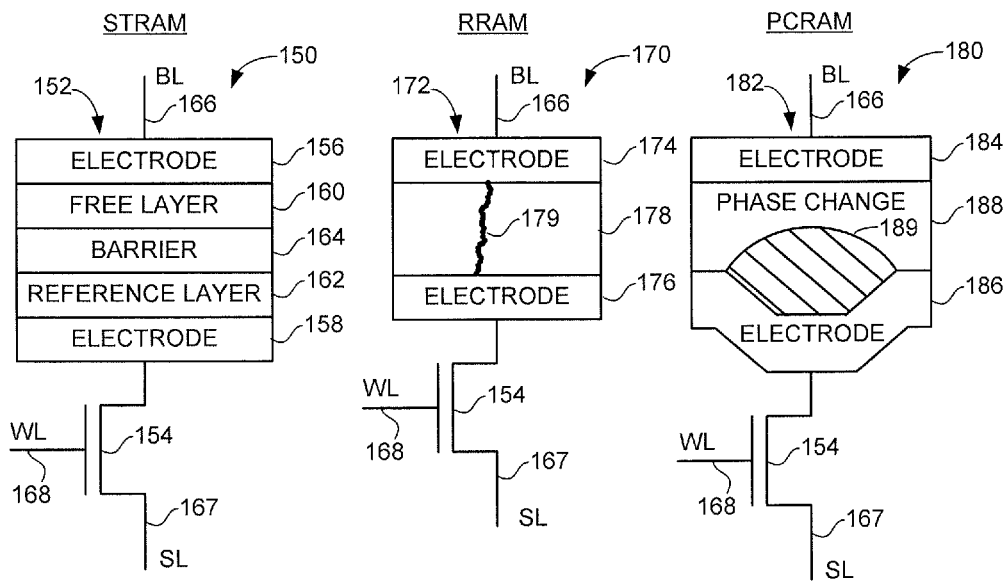
FIG. 6 represents a spin-torque transfer random access memory (STRAM) cell useful in the non-volatile (NV) write buffer of FIG. 2.
FIG. 7 illustrates a resistive random access memory (RRAM) cell useful in the non-volatile (NV) write buffer of FIG. 2.
FIG. 8 depicts a phase change random access memory (PCRAM) cell useful in the non-volatile (NV) write buffer of FIG. 2.

The present disclosure generally relates to the management of data in a data storage device.

Non-volatile (NV) memories tend to store data in such a way that the stored data persist in the memory without the need for refresh operations to maintain the data state, such as after power is removed from the memory device. A write verify operation (sometimes referred to as a write/read verify or simply read verify) can be carried out to ensure data have been successfully written to a non-volatile memory during a write operation.

Generally, a write verify operation can entail temporarily buffering the data in a local buffer memory, writing the data to a main memory so that the data are copied over from the local buffer to the main memory, reading a set of data from the main memory, and comparing the data read back from the main memory with the original set of data in the local buffer. If the two sets of data match, the write operation can be verified as having been successful, and the original set of data in the local buffer can be jettisoned or otherwise discarded to make room for other data.

If a power outage or other disturbance event occurs prior to the completion of the write verify operation, or if the data are corrupted or jettisoned from the local buffer prior to the write verify operation, the data may be lost if the write operation was unsuccessful. Because of these risks, it is common to employ a non-volatile (NV) local buffer to temporarily store high priority write data prior to transferring the data to an NV main memory.

Buffering the input data in an NV buffer helps to ensure that the data are always stored in NV memory, which tends to reduce the risk of data loss. Moreover, buffering the input data in an NV buffer allows a command complete status to be safely issued to the host device as soon as the data are received by the host, allowing the subsequent write operation to move the data to the NV main memory to be carried out at a more opportune time instead of requiring the write operation to be immediately serviced.

While operable, there remains a continued need for improvements in the manner in which write data are transferred to an NV main memory. Accordingly, various embodiments of the present disclosure are generally directed to enhancing data integrity and system reliability in a data storage system.

As explained below, some embodiments generally employ an NV main memory to which user data from a requestor (host device) are stored. The NV main memory may be in the form of a multi-tier memory structure with multiple tiers of memory of different construction and operational types. An NV write buffer is used to temporarily buffer write data pending transfer to the main memory. The NV write buffer may take a rewritable NV construction such as magnetic random access memory (MRAM), spin-torque transfer random access memory (STRAM), resistive random access memory (RRAM), phase change random access memory (PCRAM), etc. The main memory, or one or more of the memory tiers, may also have a rewritable NV construction, or may have an erasable NV construction.

Incoming write data are stored in the NV write buffer, and a write operation is scheduled and performed to transfer the write data from the NV buffer to the NV main memory. An ECC data set is generated for the set buffered write data and written to the memory as well. Metadata may also be generated to describe the stored data and ECC data set.

During processing of a subsequent write request to write updated data to the memory, a second ECC data set is generated for the buffered updated data and compared to the previously stored ECC data set. If the two ECC data sets do not match (a "mismatch"), the updated write data are scheduled for writing to the memory. If the two ECC data sets match, further comparisons may be carried out to determine whether the updated write data constitute a copy of the previously stored write data, in which case the new data are jettisoned, or constitute different data, in which case the new data are written.

In some embodiments, a hash function is used to provide ECC hash values for each of the write data sets. The ECC hash values are stored in a lookup table data structure. A lookup operation can be carried out to determine whether a calculated ECC hash value for new input data matches any existing data, and the new data are written or jettisoned accordingly. In this way, duplicate sets of the same data can be reduced in the memory, freeing up space in the memory and reducing overhead processing.

These and other features of various embodiments can be understood beginning with a review of FIG. 1 which provides a data storage device 100 constructed and operated in accordance with various embodiments. The data storage device 100 generally includes a controller 102 and a memory module 104. The controller 102 provides top level control of the device 100. The memory module 104 stores and retrieves user data from/to a requestor entity, such as an external host device (not separately shown). In some embodiments, the controller functionality can be incorporated into the memory module 104 so that a separate controller is unnecessary.

For purposes of providing a concrete example, the system 100 is contemplated as a flash memory based storage device, such as a solid state drive (SSD), a portable thumb drive, a memory stick, a memory card, etc. It will be appreciated that this is merely illustrative and not limiting, as the memory module 104 can alternatively incorporate any number of different types of non-volatile memory.

FIG. 2 illustrates portions of the device 100 of FIG. 1 in accordance with some embodiments. The controller 102 is depicted as a programmable processor having suitable programming stored in local memory to direct data transfer operations with a host device. The memory module 104 includes an interface (I/F) circuit 106, a read/write/erase (R/W/E) channel 108, a memory 110, a local volatile buffer 112, and a non-volatile (NV) buffer 114. While not limiting, in some embodiments the memory 110 comprises a multi-tier memory structure with various memory tiers 116, 117 and 118. Each of the memory tiers may have a different construction and set of performance attributes. Examples include but are not limited to PCRAM, RRAM, STRAM, flash, etc.

The I/F circuit 106 provides primary interface communications with the host to receive and transmit commands, status control information and data. The R/W/E channel 108 includes suitable row and column drivers and other decoding circuit to encode, write and read back data from the memory 110. The channel 108 carries out other operations under the direction of the controller 102 as well such as garbage collection, cache management and write verify operations.

The local buffer 112 may take the form of dynamic random access memory (DRAM) or similar construction and stores user data and metadata associated with the flash memory 110. The metadata may be stored in the memory 110 and transferred to the local buffer 112 as necessary to support various access (read and write) operations.

The NV buffer temporarily stores write data pending write verify operations upon data copied over to the memory 110, as discussed below. It is contemplated that the NV buffer 112 is rewriteable so that data may be written to the buffer and then overwritten as required.

FIG. 3 depicts a flash memory cell 120 from a selected tier of the memory 110 in FIG. 2. Doped regions 122 in a semiconductor substrate 124 form source and drain regions spanned by a gate structure 126. The gate structure includes a floating gate (FG) 128 and a control gate (CG) 130 separated by intervening barrier layers 132, 134. Data are stored to the cell 120 in relation to the accumulation of electrical charge on the floating gate 128.

FIG. 4 shows a plurality of the cells 120 arranged into columns 136 and rows 138. The cells 120 in each column 136 are interconnected in a NAND configuration and are accessed by a separate bit line (BL) 140. The cells 120 along each row 138 are connected to a separate word line (WL) 142 which interconnects the control gate (GC) 130 of each cell along the associated row.

The cells are written (programmed) by applying suitable voltages to the bit lines 140 and word lines 142 to migrate charge from the channel to the respective floating gates 128. The presence of charge on the floating gate 128 of a cell 120 increases the threshold voltage that needs to be placed on the control gate 130 to place the cell in a drain-source conductive state. The programmed states are read (sensed) by applying a succession of voltages to the respective bit lines 140 and word lines 142 to detect the threshold at which the cells are transitioned to a conductive state.

A special erasure operation is required to remove the accumulated charge and return the cell 120 to an unerased, initialized state. FIG. 5 depicts an erasure block 144 formed from memory cells 120 as set forth by FIG. 4. The erasure block 144 represents the smallest grouping of memory cells that can be subjected to an erasure operation at a time.

The data are stored in the form of pages 146. The erasure block 144 has a total of N pages, with each page storing a selected amount of data (e.g., 4096 bits, etc.). The pages 146 correspond to the rows 136 of memory cells; in single level cell (SLC) recording, each cell 120 along a selected row stores a single page worth of data. In multi-level cell (MLC) recording, each cell 120 along a selected row stores two (or more) pages worth of data. Generally, each cell can store up to N bits of data by providing $2^N$ distinct accumulated charge levels.

Because data cannot normally be overwritten to a group of flash memory cells 120 without first subjecting the cells to an erasure operation, each set of data associated with a selected logical address (e.g., a logical block address, LBA, etc.) is normally written to a new location in the memory. For example, a data block identified as LBA X may be written to Page 1 in FIG. 5. If a subsequently presented version of the data block LBA X is provided for writing, it may be written to a new location (e.g., Page 3, etc.). Generally, a next available location in the memory 110 is selected to write each new version of a given LBA. The next available location may be in the same erasure block 144, or more likely, in a more recently allocated erasure block 144.

The metadata is maintained by the device 100 to track the locations of the various versions of each LBA. The metadata may include a series of forward pointers to manage the location of the most current version of each LBA. Prior versions may be marked as stale. When sufficient levels of data are stale in an erasure block or in a larger garbage collection unit (GCU) made up of a number of such blocks, the erasure block or GCU can be subjected to a garbage collection process whereby current version data are migrated to a new location, the erasure block or GCU is erased, and the erased block or GCU is returned to an allocation pool pending allocation for subsequent use in storing user data.

As noted above, the NV buffer 114 in FIG. 2 is used to temporarily buffer input write data to be written to one or more pages 146 in the memory 110. Albeit not required, it is contemplated that the NV buffer 114 will use a rewritable solid-state non-volatile memory cell construction. Various memory tiers (e.g., 116-118) may also be formed of rewritable memory cells. A variety of constructions can be used, such as but not limited to those set forth by FIGS. 6-8.

FIG. 6 depicts a memory cell 150 having a spin-torque transfer random access memory (STRAM) configuration. The memory cell includes a magnetic tunneling junction (MTJ) 152 in series with a switching device 154. The switching device 154 is shown to constitute a metal oxide semiconductor field effect transistor (MOSFET), although other forms of switching devices can be used including unidirectional devices such as diodes, etc.

The MTJ 152 includes top and bottom conductive electrodes 156 and 158, a free layer 160, a reference layer 162 and an intervening barrier layer 164. Other MTJ configurations can be used. The free layer 160 comprises one or more layers of magnetically responsive material with a variable magnetic orientation. The reference layer comprises one or more layers of magnetically responsive material with a fixed magnetic orientation. The reference layer may include a pinning layer, such as a permanent magnet, a synthetic antiferromagnetic (SAF) layer, etc., and a pinned layer, such as a ferromagnetic layer oriented magnetically by the pinning layer. The direction(s) of the magnetic orientation may be perpendicular or parallel to the direction of current through the MTJ 152.

The MTJ exhibits different electrical resistances in relation to the orientation of the free layer 160 relative to the reference layer 162. A relatively low resistance is provided in a parallel orientation, where the free layer 160 is oriented in the same direction as the reference layer 162. A relatively high resistance is provided in an anti-parallel orientation, where the free layer 160 is oriented in the opposing direction as the reference layer 162. Spin torque currents can be applied to transition the free layer between the parallel and anti-parallel orientations.

The memory cell 150 is interconnected by a plurality of control lines, including a bit line (BL) 166, a source line (SL) 167 and a word line (WL) 168. The word line 168 operates as a select line, enabling current to pass through the MTJ 152 between the bit line 166 and the source line 167 in the desired direction.

FIG. 7 provides a resistive random access memory (RRAM) cell 170. The cell 170 includes an RRAM programmable element 172 in combination with the switching device 154 from FIG. 6. Top and bottom conductive electrodes 174, 176 separate an intervening layer that may constitute an oxide layer or electrolytic layer. The intervening layer 178 normally has a relatively high electrical resistance.

During a programming operation, ionic migration is initiated which may result in the formation of a filament 179 that lowers the electrical resistance through the RRAM element 172. The filament 179 is formed by applying a programming current sequence to the respective word, bit and source lines 166, 167 and 168. The RRAM cell 170 can be reset to its initial state by applying a different combination of voltages to the cell. Other RRAM configurations are contemplated that do not necessarily form a conductive filament, such as structures that undergo a change of state by the migration of ions or holes across a barrier or to an intermediate structure that results in a controlled change in resistance for the element 182.

FIG. 8 depicts a phase change random access memory (PCRAM) cell 180. As before, the cell 180 has a programmable element 182 in series with the switching device 154 from FIGS. 6-7. Top and bottom electrodes 184, 186 separate a phase change material 188. The phase change material is heat responsive and transitions (melts) when heated to a temperature at or above its glass transition temperature. Depending on the rate at which the layer 188 is subsequently cooled, at least a portion of the material can take an amorphous or crystalline state, with respective higher and lower resistances. FIG. 8 shows an amorphous zone 189 indicating the cell 180 is programmed to the high resistance state.

Figures 9, 10:
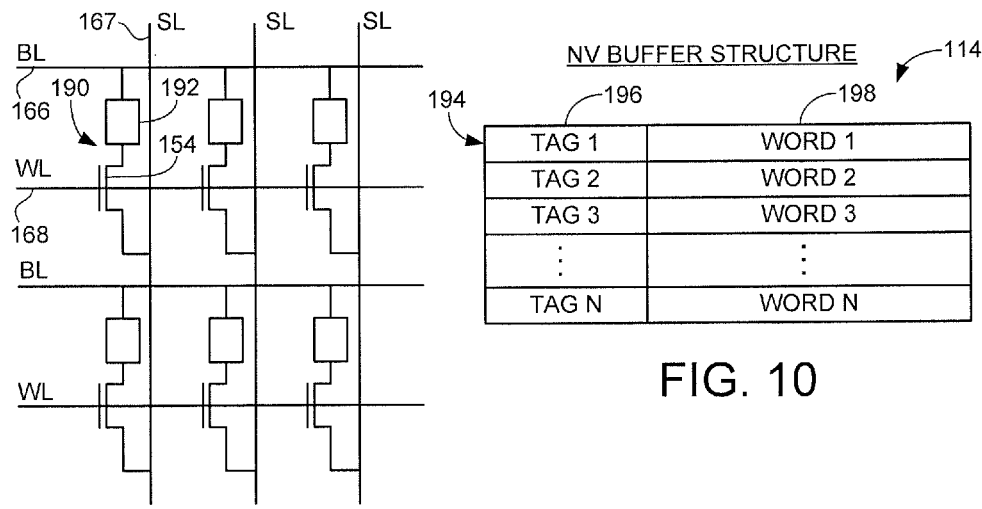
FIG. 9 is a schematic representation of an arrangement of rewriteable non-volatile memory cells of the NV buffer in accordance with some embodiments.
FIG. 10 provides an exemplary format for the NV buffer using rewriteable memory cells as arranged in FIG. 9.

It will be appreciated that other forms of non-volatile solid-state memory cells can be utilized apart from those exemplified in FIGS. 6-8. FIG. 9 shows the general use of NV memory cells 190 each having a resistive sense element (RSE) 192, which may correspond to a selected one of the elements 152, 172 and 182 in FIGS. 6-8, in combination with a switching device such as the device 154. The cells are arranged into rows and columns and interconnected via the aforementioned bit, source and word lines 166, 167 and 168.

Although not required, it is contemplated that the NV buffer 114 in FIG. 2 will take a construction such as set forth in FIG. 9. The NV buffer 114 will be rewritable in nature so that each set of cells along each word line 168 can be arranged to store data pending transfer to the main flash memory 110, and then overwritten with new data as required without the need to subject the memory to an erasure operation.

The NV buffer 114 may have a faster data I/O rate than the memory 110, so that data can be quickly written to and read out of the NV buffer 114 as required to support access operations with the memory. The NV buffer 114 may be arranged in the form of a content addressable memory (CAM) or similar cache structure. FIG. 10 shows an exemplary CAM structure for the NV buffer 114. The CAM structure can store up to N entries 194. Each entry includes an identifier tag in a tag field 196 and a word payload in a word field 198. The identifier tags may be LBA addresses, and the word payloads may be corresponding page data associated with the LBA address.

Figure 11:
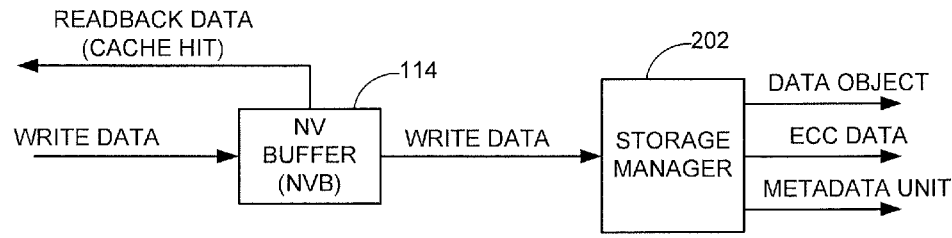
FIG. 11 illustrates an exemplary data write operation.

FIG. 11 illustrates aspects of the device 100 in accordance with some embodiments. A set of input write data supplied to the device in conjunction with a write request from a requestor is temporarily cached in the NV buffer (NVB) 114. A write operation is scheduled. Writeback processing may be employed so that the requestor is immediately notified that the data have been successfully written, freeing up the requestor to move on to a next access operation. During the subsequent write operation, a storage manager 202 uses the write data to generate a data object, a corresponding ECC data set, and a metadata unit.

The data object generally comprises the user data set forth in the write data, such as in the form of one or more data sectors each having a corresponding logical address, such as a logical block address (LBA). The data object may have further control information incorporated therein, such as header information, hash values, status values, etc.

The ECC data set is adapted to detect and/or correct up to a selected number of bit errors in the data object during a subsequent readback operation. The ECC data can take a variety of suitable forms such as cyclical error correcting codes such as Bose, Ray-Chaudhuri and Hocquenghem (BCH) codes or Reed Solomon codes, low density parity check (LDPC) codes, exclusive-or (XOR) values, outercode, IOEDC values, checksums, and other forms of control data. More than one type of ECC code data may be generated as the ECC data set for a selected data object.

The size and strength of the ECC data can be selected and subsequently adjusted based on attributes of the data object as well as on attributes of the memory tier in which the ECC data are stored (e.g., number of writes/erasures/reads, aging, drift parametrics, etc.). Generally, the size of an ECC code word generally determines the size of the ECC storage footprint (coderate). Similarly, the sub-code word granularity may be selected in view of the likelihood of read-modify-write operations upon the ECC during operation.

The strength of the ECC data set generally relates to how effective the ECC data set is in detecting and, as utilized, correcting up to a selected number of data bit errors. A stronger ECC data set will generally detect and correct more errors than a weaker ECC data set.

Layered ECC can be used to strengthen ECC protection. A first type of code, such as BCH, can be applied to a data object. A second type of code, such as Reed Solomon, can then be applied to some or all of the BCH code words. Other layers can be applied to achieve an overall desired strength. It will be noted that the strength of the ECC may be selected based on the storage characteristics of the associated data; a memory tier that demonstrates strong performance (high endurance, good retention characteristics, low data bit errors, etc.) may warrant the use of a relatively weaker ECC scheme. Conversely, older, worn and or relatively low endurance memory may warrant the use of stronger ECC. Since in the present embodiments the ECC is stored separately from the data objects, flexibility is provided to allow the appropriate level of ECC to be applied without the constraint of keeping the ECC in the same tier as the protected data objects.

The metadata unit enables the device 100 to locate the data objects and ECC data and accordingly stores a variety of control information such as data object (DO) address information, ECC address information, data and memory attribute information, one or more forward pointers and a status value. Other metadata formats can be used. The address information identifies the physical addresses of the data object and the ECC data, respectively, and may provide logical to physical address conversion information as well. The physical address will include which tier (e.g., MEM 1-3 in FIG. 2) stores the data set, as well as the physical location within the associated tier at which the data set is stored using appropriate address identifiers such as row (cache line), die, array, plane, erasure block, page, bit offset, and/or other address values.

The data object, ECC data and metadata unit may be written to the same memory tier/type or may be distributed such that these respective data sets are stored in different locations in the memory 110. In some embodiments, the data object is stored in a first tier, the ECC data set is stored in a different, second tier, and the metadata unit is stored in a different, third tier. The formats for each of these data sets may be adapted to match the storage attributes of these respective tiers.

Once the respective data object, ECC data and metadata unit have been written to the memory 110, the write data may remain resident in the NV buffer 114 to satisfy subsequent read cache hits, as depicted in FIG. 11. Moreover, during a read sequence the device may operate to perform a speculative data pull to migrate data objects into the NV buffer in anticipation of future cache hits.

Figure 12:
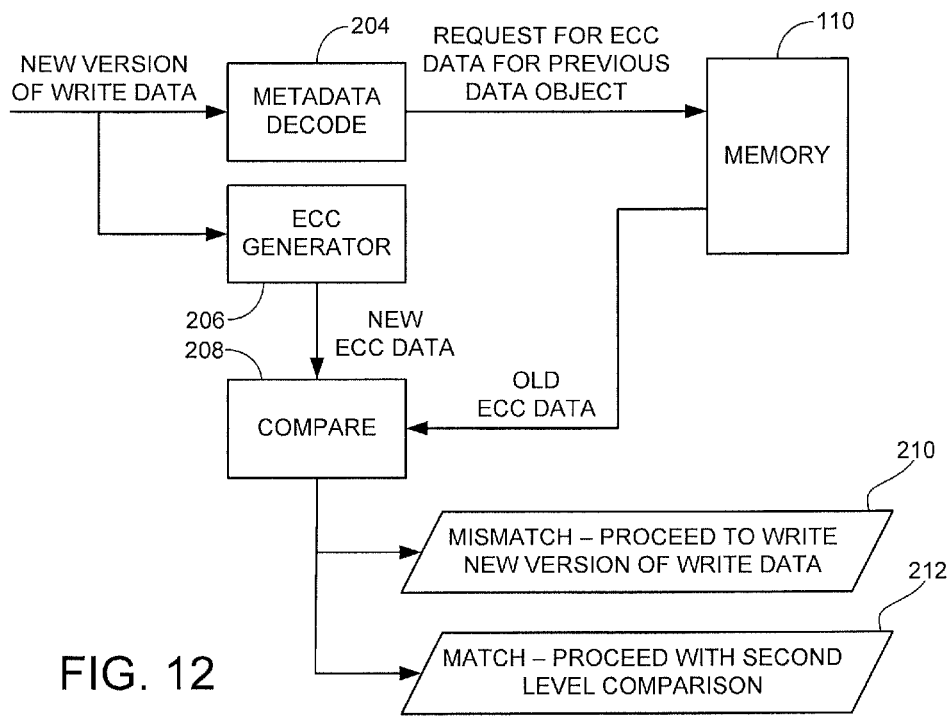
FIG. 12 illustrates a comparison operation carried out by the device of FIG. 2 in accordance with some embodiments.

FIG. 12 depicts a subsequent write sequence in which a new version of write data is presented to the device 100 for writing to the memory 110. The new version of write data shares logical addressing (e.g., has the same LBA value(s)) as the data written in FIG. 11. As before, writeback processing may be employed to signal the requestor that the data have been successfully written while the new version of data remains resident in the NV buffer 114. Prior to transferring the data as in FIG. 11, however, a fast reject processing operation may be carried out.

A metadata decode block 204 determines the storage location of the ECC data set for the previous version of data, and retrieves the same to a local memory. An ECC generator block 206 generates a new ECC data set based on the cached write data. A compare circuit 208 compares the new ECC data with the old ECC data.

If a mismatch exists between the respective sets of ECC data, as signified at block 210, the storage manager 202 proceeds to store the new write data in the form of a new data object, new ECC data set (which has already been generated) and a new metadata unit.

The new data sets may be overwritten onto the previous data sets in the case of rewritable memory, or the new data sets may be written to one or more new locations, including one or more different memory tiers as compared to the older version data sets. In some cases, the old metadata unit is updated with one or more forward pointers to identify the new location of the most current version of the data.

On the other hand, if the two ECC data sets match, as signified at block 212, further comparisons may be required in order to determine whether the new data represents an identical copy of the previously stored data, or whether the new data are different from the previously stored data. If identical, there is no need to store the new data and the new data can be jettisoned from the NV buffer without further processing. Thus, the ECC data can provide a fast reject processing mechanism that does not require the calculation of additional data in order to reduce write amplification (unnecessary duplicate copies of the same content).

The format of the returned ECC data may be gleaned from the memory tier in which the ECC data are stored. For example, a first type of ECC scheme may be applied for ECC data stored in a first tier, and a different, second type of ECC scheme may be applied for ECC data stored in a different, second tier. Accordingly, the metadata may indicate which ECC scheme should be applied to the new cached data to generate the new ECC data set, so that the new ECC data set can be generated during the read operation upon the previous ECC data set.

Figure 13:
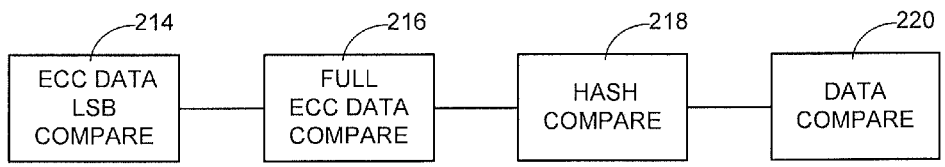
FIG. 13 depicts a sequence of comparison operations carried out in accordance with some embodiments.

FIG. 13 illustrates a sequence of different levels of comparisons that can be carried out in accordance with some embodiments. At block 214, a subset of the entire ECC data set, such as the lowest X bits (e.g., 8 least significant bits, LSBs) can be used as the basis for the first level of comparison. A collision at the byte (8-bit) level, that is, a mismatch, will tend to provide an accurate indication with a very high statistical probability (e.g., 99.5% or greater), that the data do not match.

If the LSBs match, a larger section of the respective ECC data sets can be compared, such as a full comparison of the entire ECC data sets as depicted at block 216. Subsequent levels include generating hash values using a suitable hash function, such as a Sha hash, and performing a comparison of the hash values, as represented by block 218. Finally, a full comparison of the entire data sets, such as via an exclusive-or (XOR) comparison involving both data objects, can be used to determine whether the new data differ from the old (block 220).

It will be recognized that the ECC data will tend to be a relatively small fraction in terms of size in comparison to the user data. For example, the ECC data may constitute from 1% to 20% of the size of the data objects. The smaller size of the ECC data presents opportunities to store the ECC in a suitable memory tier for easy access during fast reject processing, by comparing the existing ECC data for a selected logical address to new ECC data for data associated with the same logical address.

Since many operational environments will tend in most cases to present unique data with new write requests, and ECC data are generated quickly and efficiently, performing an additional fast reject comparison of the new ECC data with existing ECC data can let the system reach the determination that the new data are in fact different data without significant additional processing, including the need to calculate hash values or other complex calculations.

The foregoing processing generally tends to require a data lookup operation to access the metadata for the input data, and then retrieve the ECC data from the memory 110. In another embodiment, a portion of memory, such as a part of the memory 110, can be configured to store ECC data in a lookup table or other data structure. In this way, a fast data comparison can be carried out to determine whether further processing may be required for de-duplication write processing.

Figure 14:
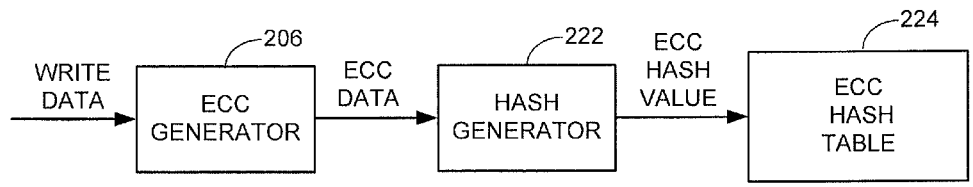
FIG. 14 shows use of an ECC hash value table in accordance with some embodiments.

FIG. 14 depicts an exemplary circuit in which input write data cached in the NV buffer 114 are supplied to the ECC generator 206 to generate an ECC data set, as before. In FIG. 14, however, a hash generator 222 is additionally employed to generate an ECC hash value, which may be smaller in terms of bit-size than the ECC data. The ECC hash value is then appended to an ECC hash table 224, which represents an easily searchable data structure.

The hash generator 222 generates the hash values using a hash function, which can be characterized as any number of different types of algorithms that map a first data set (a "key") of selected length to a second data set (a "hash value") of selected length. In many cases, the second data set will be shorter than the first set. The hash functions used by the hash generator should be transformative, referentially transparent, and collision resistant.

Transformation relates to the changing of the input value by the hash function in such a way that the contents of the input value (key) cannot be recovered through cursory examination of the output hash value. Referential transparency is a characteristic of the hash function such that the same output hash value will be generated each time the same input value is presented. Collision resistance is a characteristics indicative of the extent to which two inputs having different bit values do not map to the same output hash value. The hash function(s) employed by the generator 222 can take any number of forms, such as checksums, check digits, fingerprints, cryptographic functions, parity values, etc.

In some embodiments, the hash values can be one or more selected bit values in the ECC data. More complex hash functions can include Sha hashes (such as Sha 128 or Sha 256) or one or more selected bit values from the resulting Sha hash values. A bloom filter or other analysis engine can be used to combine multiple inputs to arrive at the ECC hash value.

Figure 15:
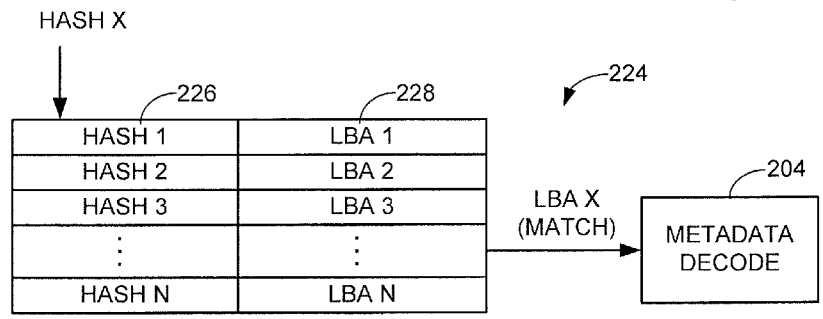
FIG. 15 illustrates a fast reject process using the table of FIG. 14.

FIG. 15 depicts a subsequent search operation upon the ECC hash table 224 in FIG. 14. As shown in FIG. 15, a number of entries are provided in the table. Other arrangements can be used. Each entry in FIG. 15 includes a hash value field 226 with example hash values HASH 1-N and corresponding logical addresses in a logical address field 228 (for LBAs 1-N. It will be understood that the respective fields can be sorted and/or arranged as desired.

A newly generated hash value (HASH X) for new cached write data is generated in accordance with FIG. 14. A search is made to identify a match between the input HASH X and the contents of the hash fields 196. If no match occurs, the system determines that the new data represent unique write data and are processed as discussed above in FIG. 11. If a match is detected, the logical addressing (LBA X) for the associated entry is output to the metadata decode block 204 for further processing in accordance with FIGS. 12-13.

Figure 16:
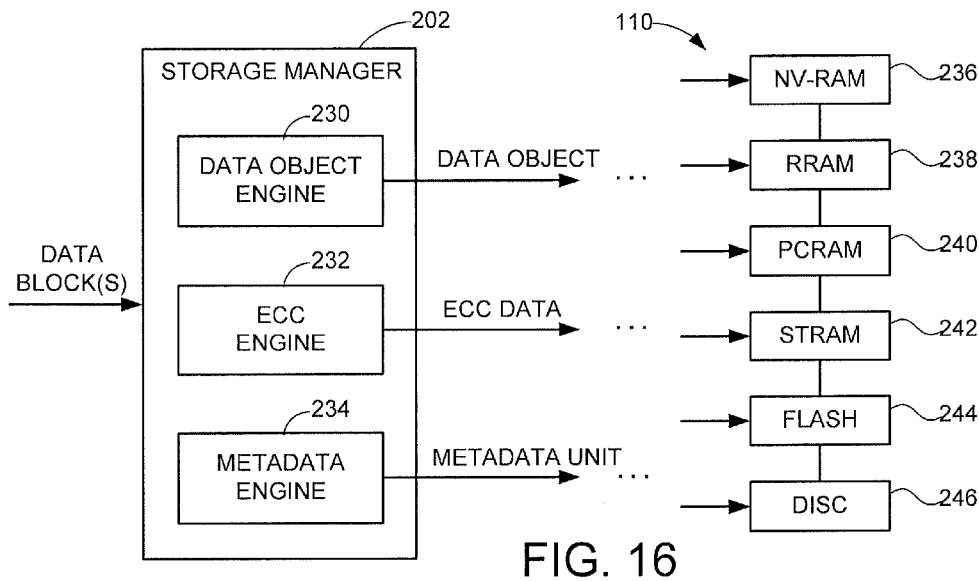
FIG. 16 depicts another arrangement of a multi-tier memory structure in accordance with further embodiments.
Figure 17:
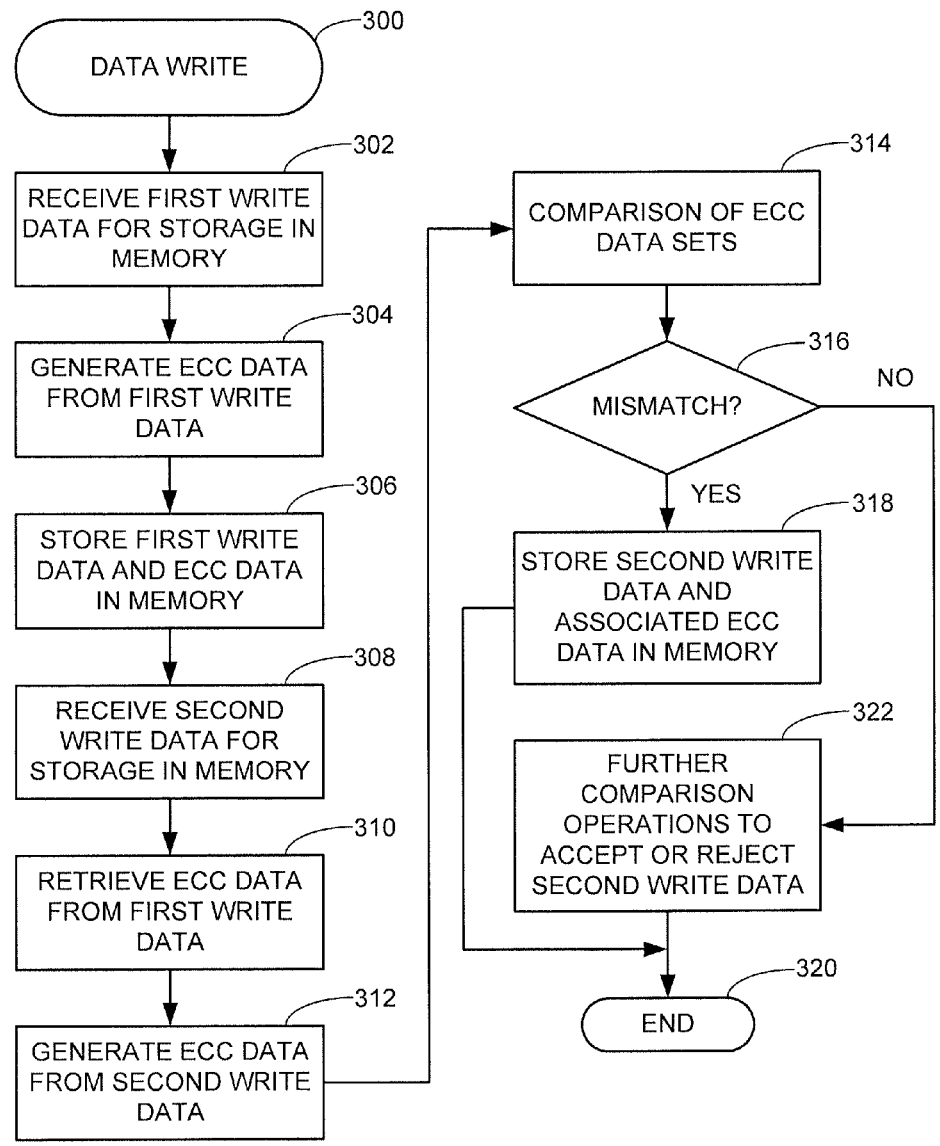
FIG. 17 is a DATA WRITE routine generally representative of steps that can be carried out in accordance with various embodiments of the present disclosure.

FIG. 16 shows the storage manager 202 of FIG. 11 in accordance with further embodiments. The storage manager 202 can be realized in hardware or programming steps used by the controller 102 of FIG. 1. The storage manager 202 includes a data object engine 230, an ECC engine 232 and a metadata engine 234 which respectively generate suitable data objects, ECC data sets and metadata units responsive to the presentation of input data blocks of write data.

The respective engines 230, 232 and 234 can additionally be configured to select appropriate tiers in the memory 110 for the respective storage of these data sets. To provide another illustrative example, the memory 110 is shown to include an NV-RAM tier 236, an RRAM tier 238, a PCRAM 240, an STRAM tier 242, a flash memory tier 244 and a rotatable disc tier 246. Generally, the respective tiers are in a priority order from fastest to slowest in terms of data I/O transfer rate.

FIG. 7 provides a flow chart for a DATA WRITE routine 300, which generally summarizes steps that may be carried out in accordance with some embodiments. The device 100 will be used as an example to explain the routine, although the routine can be utilized with other types of data storage devices and other operational environments.

A first set of write data is received for storage into a memory at step 302. A set of ECC data is generated from the first write data at step 304, and both the input write data and the ECC data set are stored in suitable memory locations at step 306. These steps correspond to FIGS. 11 and 16.

A second set of write data is subsequently received at step 308 for storage to memory. In order to determine whether this new data is different from, or merely a copy of previously stored data in the memory, the ECC data associated with the first write data are retrieved from memory, step 310, and a second set of ECC DATA for the new data is generated, step 212. These steps generally correspond to FIG. 12.

A comparison operation next takes place at step 314. This can include the various comparisons and decision points set forth above. It will be appreciated that a fast reject process is used so that the types of values and comparisons made therebetween are weighted to urge as quick detection of differences between the respective data sets.

Ultimately, a decision is made either way, as shown by decision step 316. If a mismatch is found, the process continues to step 318 where the second write data and the associated ECC data are stored in memory. As desired, the first write data and associated ECC data can be marked for erasure as being stale (out of revision) data after which the process ends at step 320. If the data sets are found to match through comparisons of the respective hash values, further comparison operations may be carried out at step 322 to make a final determination, after which the routine ends at step 320.

It will now be appreciated that the various embodiments presented herein can provide a number of benefits. The use of an NV buffer to temporarily buffer input write data may help to reduce data loss in the event of power loss or other anomalous event. The use of fast reject processing using ECC data values can enable efficient determinations as to whether the new input data match one or more existing data sets.

Although not necessarily limiting, it is contemplated that a rewriteable NV buffer, such as but not limited to RRAM, STRAM, PCRAM, etc. can advantageously extend the operational performance of an NV main memory tier made of a different construction, such as erasable flash memory. Other types of buffer and main memory can be used.

Numerous characteristics and advantages of various embodiments of the present disclosure have been set forth in the foregoing description, together with structural and functional details. Nevertheless, this detailed description is illustrative only, and changes may be made in detail, especially in matters of structure and arrangements of parts within the principles of the present disclosure to the full extent indicated by the broad general meaning of the terms in which the appended claims are expressed.

What is claimed is:

1. A method comprising:
generating and storing a first data object and an associated first ECC data set in a non-volatile (NV) memory responsive to a first set of data blocks with a selected logical address;
generating a second data object and an associated second ECC data set responsive to receipt of a second set of data blocks having the selected logical address; and
storing the second data object and the second ECC data set in the NV main memory responsive to a mismatch between the first ECC data set and the second ECC data set.

2. The method of claim 1, further comprising comparing a first hash value formed from the first data object and a second hash value formed from the second data object responsive to a match between the first ECC data set and the second ECC data set, and storing the second data object in the NV main memory responsive to a mismatch between the first hash value and the second hash value.

3. The method of claim 1, further comprising using a selected hash function to generate a first ECC hash value from the ECC data set and a second ECC hash value from the second ECC data set, and comparing the first and second ECC hash values.

4. The method of claim 3, further comprising storing the first and second ECC hash values in a lookup table in a local memory, generating a third ECC hash value based on a third ECC set for a third set of received data blocks, and searching the lookup table for a match between the third ECC hash value and the first and second ECC hash values, wherein a match during the searching of the lookup table results in a transfer of an associated ECC value from the non-volatile memory for comparison to the third ECC data set.

5. The method of claim 1, in which the NV main memory comprises a multi-tier non-volatile memory structure comprising a plurality of memory tiers each having a different construction and arranged in a priority order, wherein at least one of the memory tiers comprises a rewritable memory tier and at least one of the memory tiers comprises an erasable memory tier.

6. The method of claim 5, in which the data object is stored in the erasable memory tier and the ECC data set is stored in the rewritable memory tier.

7. The method of claim 1, further comprising comparing a subset of bits of the ECC data set in a selected bit placement location thereof to a corresponding subset of bits of the second ECC data set in the same selected bit placement location thereof.

8. The method of claim 1, further comprising generating a first metadata unit to describe a physical address within the NV main memory at which the data object and associated ECC data set are stored, and using the first metadata unit to retrieve a copy of the associated ECC data set for comparison to the second ECC data set.

9. The method of claim 1, further comprising temporarily storing the second set of data blocks in an NV write buffer coupled to the NV main memory, the write buffer comprising rewritable NV memory cells, wherein the second set of data blocks are in the NV write buffer are used to generate the second data object responsive to a mismatch between the ECC data set and the second ECC data set, and wherein the second data object is not stored in the NV main memory responsive to a match between the ECC data set and the second ECC data set.

10. The method of claim 1, in which the ECC data set and the second ECC data set are formed responsive to application of a cyclical error correcting code to the respective first and second sets of data blocks.

11. An apparatus comprising:
a non-volatile (NV) write buffer adapted to store first write data having a selected logical address;
an NV main memory coupled to the write buffer; and
a storage manager adapted to transfer a copy of the first write data and a corresponding first ECC data from the write buffer to the main memory, the first ECC data adapted to detect up to a selected number of bit errors in the transferred copy of the first write data during a subsequent readback operation, wherein the storage manager is further adapted to, responsive to receipt of second write data having the selected logical address in the write buffer, generate second ECC data associated with the second write data and store the second write data to the main memory responsive to a mismatch between the first ECC data and the second ECC data.

12. The apparatus of claim 11, in which the storage manager compares only a portion of the second ECC data to a corresponding portion of the first ECC data to detect said mismatch.

13. The apparatus of claim 11, in which the storage manager further applies a hash function to the first and second ECC data to generate respective first and second ECC hash values, and stores the first and second hash values in a lookup data structure.

14. The apparatus of claim 11, in which, responsive to a match between the first ECC data and the second ECC data, the storage manager further compares a first hash value formed from the first write data to a second hash value formed from the second write data and stores the second write data to the main memory responsive to a mismatch between the first and second hash values.

15. The apparatus of claim 11, further comprising a hash generator which uses a selected hash function to generate a first ECC hash value formed from the first ECC data and a second ECC hash value formed from the second ECC data, and a comparison circuit which compares the first and second ECC hash values.

16. The apparatus of claim 15, in which the main memory comprises a multi-tier memory structure comprising a plurality of NV memory tiers each having a different construction and arranged in a priority order, wherein at least one of the memory tiers comprises a rewritable memory tier and at least one of the memory tiers comprises an erasable memory tier.

17. The apparatus of claim 16, in which the rewritable memory tier comprises resistive random access memory (RRAM) cells, phase change random access memory (PCRAM) cells or spin-torque transfer random access memory (STRAM) cells, and the erasable memory tier comprises flash memory cells.

18. An apparatus comprising:
a non-volatile (NV) write buffer;
a multi-tier main memory structure comprising a plurality of NV memory tiers arranged in a priority order and each having different storage attributes; and
a controller adapted to temporarily cache input write data in the write buffer pending transfer to the main memory structure, the controller comprising a programmable processor having associated programming to:
generate and store a first data object and an associated first ECC data set in the main memory structure responsive to a first set of data blocks in the write buffer having a selected logical address;
generate a second data object and an associated second ECC data set responsive to receipt of a second set of data blocks in the write buffer having the selected logical address; and
store the second data object and the second ECC data set in the main memory structure responsive to a mismatch between the first ECC data set and the second ECC data set.

19. The apparatus of claim 18, in which the multi-tier main memory structure comprises an upper rewritable memory tier and a lower erasable memory tier with respect to said priority order, the controller storing the first and second ECC data sets in the upper rewritable memory tier and storing the first and second data objects in the lower rewritable memory tier.

20. The apparatus of claim 18, in which the controller is further adapted to:
maintain a lookup table in a local memory of ECC hash values and associated logical addresses for each of a plurality of data objects stored in the main memory structure; and
for each new set of data blocks received into the write buffer, generate a new data object and an associated new ECC data set, apply a hash function to the new ECC data set to generate a new ECC hash value, and perform a search of the lookup table for a match between the ECC hash value and the ECC hash values stored therein.

* * * * *